United States Patent [19]
Laker et al.

[11] 3,942,140
[45] Mar. 2, 1976

[54] METHOD AND MEANS FOR COUPLING A MULTIPLICITY OF SURFACE ACOUSTIC WAVE TRANSDUCERS TO A SINGLE ELECTROMAGNETIC WAVE TRANSMISSION LINE

[75] Inventors: Kenneth R. Laker; Alan J. Budreau, both of Arlington; Paul H. Carr, Bedford, all of Mass.

[73] Assignee: The United States of America as represented by the Secretary of the Air Force, Washington, D.C.

[22] Filed: Nov. 8, 1974

[21] Appl. No.: 522,367

[52] U.S. Cl. .................. 333/72; 310/9.8; 333/30 R
[51] Int. Cl.².. H03H 9/26; H03H 9/30; H03H 9/32; H01L 41/08
[58] Field of Search ............. 333/72, 30 R; 310/9.8, 310/8.0, 8.1, 8.2

[56] References Cited
UNITED STATES PATENTS

| | | |
|---|---|---|
| 3,446,975 | 5/1969 | Adler et al. ........................ 333/72 X |
| 3,522,557 | 8/1970 | Duncan et al. .................... 333/72 X |
| 3,750,027 | 7/1973 | Hartmann ......................... 333/72 X |
| 3,790,828 | 2/1974 | Chao .................................. 310/9.7 |
| 3,855,556 | 12/1974 | Hartmann ..................... 333/30 R X |
| 3,858,118 | 12/1974 | Daniel .............................. 333/72 X |

*Primary Examiner*—Archie R. Borchelt
*Assistant Examiner*—Marvin Nussbaum
*Attorney, Agent, or Firm*—Joseph E. Rusz; Willard R. Matthews, Jr.

[57] ABSTRACT

The input transducers of a multichannel surface acoustic wave device are electrically connected in a series or series-parallel circuit arrangement and are connected to a single channel electromagnetic wave transmission line through an inductor. The inductance value of the inductor is chosen such that minimum transducer insertion loss is achieved at the center frequency of the midband channel. The circuit arrangement is selected which achieves optimum coupling to the midband channel subject to the constraint that the insertion losses of all the remaining channels, measured at their respective center frequencies, lie at or near the above optimum value within an acceptable prespecified margin.

2 Claims, 10 Drawing Figures

SERIES - PARALLEL INPUT TRANSDUCER NETWORK

EQUIVALENT TRANSDUCER NETWORK

3,942,140

METHOD AND MEANS FOR COUPLING A MULTIPLICITY OF SURFACE ACOUSTIC WAVE TRANSDUCERS TO A SINGLE ELECTROMAGNETIC WAVE TRANSMISSION LINE

BACKGROUND OF THE INVENTION

This invention relates to multichannel surface acoustic wave devices, such as frequency synthesizers and multipliers and, in particular, to means for coupling the multiple transducers thereof to single channel electromagnetic wave input and output transmission lines.

The design of multiplexers, which split a single channel carrying many frequencies into a number of separate channels carrying narrower bands of frequencies, is a problem frequently encountered by design engineers. Similar filter groups are often required for the inverse process of summing a number of channels carrying different bands of frequencies so that all of the frequencies can be put in a single broadband channel with minimum loss of energy.

The inherent properties of surface acoustic wave technology which permit the realization of compact, low cost filter networks are well known. These size and cost advantages also apply to UHF and microwave frequency multiplexer realizations. Furthermore, it is readily possible to utilize their frequency selective features in multiplexer design. In most single-filter design procedures, only the transmission response is considered and little attention is given to the input impedance characteristics. For mulitplexer design, requiring the coupling of N individual filters, the performance of a given channel (filter) is considerably affected by the impedance levels of the remaining channels (filters). In order to obtain desirable low channel insertion losses the surface wave filter input impedances must be carefully considered.

In multiple channel frequency multiplexers and similar multichannel acoustic wave devices much of the loss occurs during the division of the source energy to the individual input transducers. An ideal solution would be a sophisticated matching network; however, the bulk and complexity of the required circuitry would to some extend nullify the inherent compactness and simplicity of the acoustic surface wave filterbank approach.

There currently exists, therefore, the need for simplified means and techniques for coupling mutliple acoustic surface wave transducers to a single channel electromagnetic transmission line. The present invention is directed toward satisfying this need.

SUMMARY OF THE INVENTION

The invention comprehends a circuit for coupling the transducers of a multichannel surface acoustic wave device to a single channel electromagnetic wave transmission line. The circuit connects the input (transmitting) transducers into a series or series-parallel arrangement comprising $m$ parallel branches of $n$ series connected transducers. This circuit is connected to the transmission line through an inductor. The inductor has an inductance value that provides minimum insertion loss at the operating center frequency of the acoustic wave device. The transducer connection circuit is selected as the particular series parallel arrangement that provides minimum insertion loss within certain prescribed insertion loss variation constraints.

It is a principal object of the invention to provide a new and improved method for coupling multiple surface acoustic wave device transducers to a single channel electromagnetic wave transmission line.

It is another object of the invention to provide a new and improved electrical circuit for connecting multiple surface acoustic wave device transducers to a single channel electromagnetic wave transmission line.

It is another object of the invention to provide improved coupling means for connecting multiple surface acoustic wave device transducers to a single channel electromagnetic wave transmission line, such coupling means having minimum insertion loss and acceptable insertion loss variation characteristics with a minimum amount of external circuitry.

These, together with other objects, advantages and features of the invention will become more readily apparent from the following detailed description taken in conjunction with the illustrative embodiment in the accompanying drawings.

DETAILED DESCRIPTION OF THE PREFERRED EMBODIMENT

Figure 1:
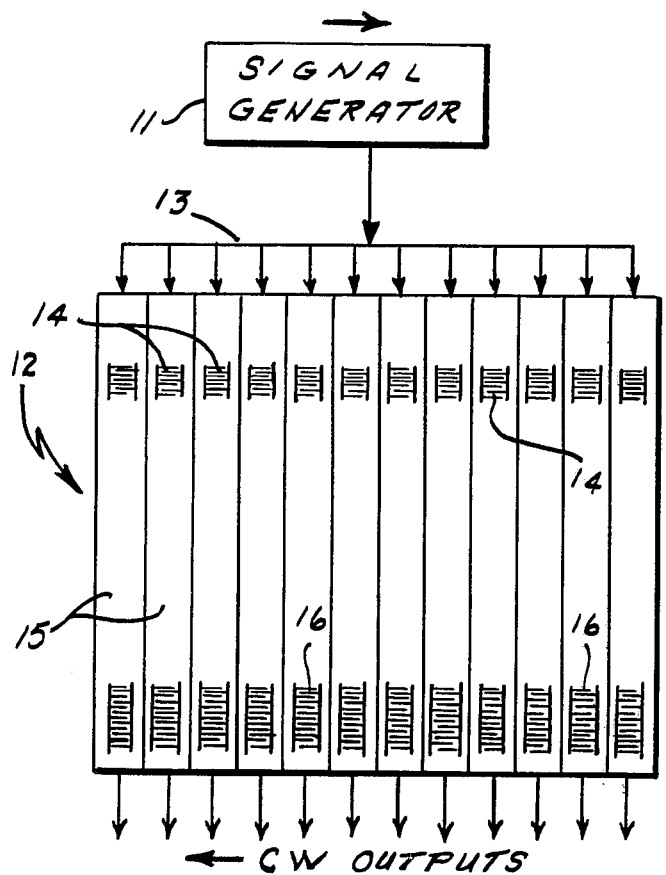
FIG. 1 illustrates schematically a surface acoustic wave multichannel device.
Figure 2:
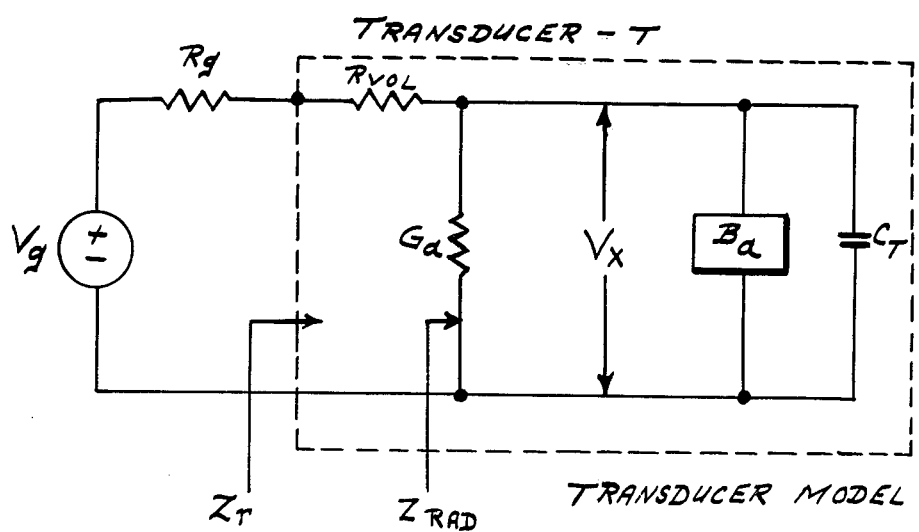
FIG. 2 is a schematic diagram of the transducer model used in the derivation of certain equations for the invention.

A surface acoustic wave multiplexer of the type comprehended by the invention is illustrated schematically by FIG. 1. A substrate member 12 of appropriate piezoelectric material is divided into a multiplicity of channels 15. Input transducers 14 convert electromagnetic wave energy into surface acoustic wave energy and output transducers 16 reconvert the surface acoustic wave energy back into electromagnetic wave output signals. The device is supplied from signal generator 11 through parallel feed circuit 13. In accordance with the method of the present invention the transducer input impedance is computed based on the transducer model shown in FIG. 2. These computations combine the impulse model theory described by C. S. Hartmann, D. T. Bell, Jr., and R. C. Rosenfeld, in the periodical article entitled, "Impulse Model Design of Acoustic Surface Wave Filters," *IEEE Trans. on Microwave Theory and Techniques*, Vol. MTT-21, pp. 162–175, April 1973, with experimental volume mode loss measurements ($\hat{R}_{VOL}$). The transducer radiation conductance ($G_a$) and susceptance ($B_a$) are computed with an impulse model in which volume mode generation is ignored and the thinned areas are assumed inactive, i.e.:

$$G_a(\omega) = \left(\frac{\sin x}{x}\right)^2 \left\{ G_o + \sum_{n=1}^{n-1} G_n \cos 2nKx \right\} \quad (1)$$

$$B_a(\omega) = G_o \frac{\sin 2x - 2x}{2x^2} \quad (2)$$

$$\sum_{n=1}^{\hat{N}-1} G_n \left[ \frac{\sin 2nKx - \frac{1}{2}(\sin 2(nK-1)x + \sin 2(nK+1)x)}{2x^2} \right]$$

and $$C_T = \hat{N} N_i C_S \quad (3)$$

where $$x = \frac{N_i \pi (f - f_o)}{f_o}, \quad G_o = 8k^2 \hat{N}_i^2 N C_S f_o ,$$

$$G_n = 16k^2 N_i^2 (\hat{N} - n) C_S f_o , \quad (4)$$

$$C_S = \frac{L v_s}{f_o} (\epsilon p + 1) \left\{ 1.625(DQL)^2 + 0.54\, DQL + 2.37 \right\} X 10^{-12} f$$

and
$N_i \triangleq$ number of interdigital periods in a transducer tap
$K \triangleq$ number of $N_i$ missing interdigital periods between each pair of taps ($K = 2.5$)
$N \triangleq$ number of transducer taps ($N = 26$)
$K^2 \triangleq$ material coupling coefficient ($k^2 = 0.0074$ for YZ LiTaO$_3$,
$p \triangleq$ dielectric constant ($p = 47.9$ for ZY LiTaO$_3$, 10.0 for $AN$)
$DQL \triangleq$ finger width to spacing ratio ($DQL = 1.0$)
finally $$R_{VOL} = R_{VOL} + R_C \quad (5)$$

where $R_{VOL} = 11$ ohms for YZ LiTaO, 3 ohms for $A\ N$ and $$R_C = 8/3\, (res) L/(N_i N)(res = 0.345 / R_C = 1.2). \quad (6)$$

Utilizing this model together with observed multiple channel impedance behavior, a simple insertion loss minimization technique is developed as hereinafter described. It is noted that given the appropriate circuit model, the technique is applicable to any transducer configuration.

Figure 3:
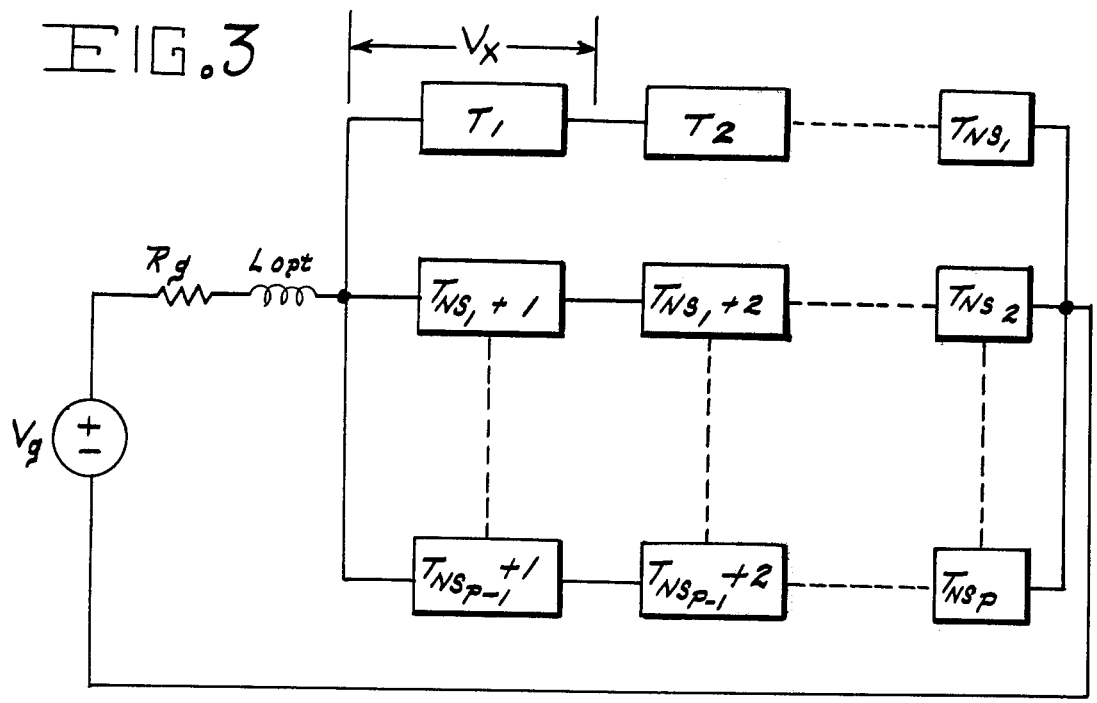
FIG. 3 is a block diagram of the series-parallel transducer network comprehended by the invention.
Figure 4:
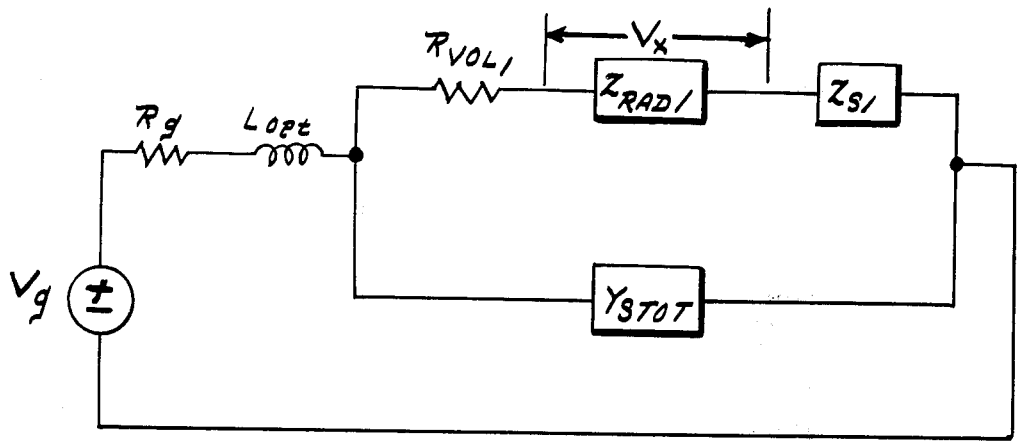
FIG. 4 is a block diagram illustrating the equivalent transducer network of FIG. 3.

It has been observed that a simple series or series-parallel interconnection of input transducers results in a combined impedance which approximates a constant over the desired band. This observation indicates that low interchannel coupling loss and adequate in band uniformity can be achieved with a single inductor and a series-parallel input transducer network as described in FIG. 3. The equivalent circuit shown in FIG. 4 is completely general, in that it permits the computer simulation and analysis of any series, parallel or series-parallel transducer network, with a single computer program. In analyzing this network it is of particular interest to determine the channel insertion loss (i.e., the amount of available source energy actually radiated by the input transducer) for each individual channel. The insertion loss associated with a given channel, denoted channel 1 in FIG. 3, is readily determined:
i.e., if $$Y_{RAD1} = G_{a1} + j(B_{a1} + \omega C_{T1}), \quad Z_{ST} = R_{VOL1} + Z_{S1}$$

$$Z_{S1} = \sum_{k=2}^{NS_1} Z_{TR}$$

and $$Y_{STOT} = \sum_{k=2}^{NP} (1/Z_{SERk}) \text{ where } Z_{SERk} = \sum_{k=NS_{k-1}}^{NS_k} Z_{Tk}$$

then $$IL = -10 \log_{10} \left\{ 2G_{a1} R_g \left| \frac{Y_{ST}}{Z_g Y_{RAD1} Y_{ST} + (Z_g Y_{STOT} + 1)(Y_{RAD1} + Y_{ST})} \right|^2 \right\} \quad (7)$$

where:

$Z_g = R_g + j\omega L_{opt}$, and $Y_{ST} \triangleq \frac{1}{Z_{ST}}$.

For a given transducer network an optimum inductor value ($L_{opt}$) which yields minimum insertion loss may be determined. To facilitate this computation the denominator of Equation (7) is rewritten $$D = (R_g + j\omega L_{opt}) \epsilon_1 + \epsilon_2 \qquad (8)$$

where $$\epsilon_1 = Y_{RADI} Y_{ST} + Y_{STOT} (Y_{RADI} + Y_{ST}) \text{ and}$$
$$\epsilon_2 = Y_{RADI} + Y_{ST} \qquad (9)$$

$L_{opt}$ is now determined by maximizing square magnitude of $D$ $$|D|^2 = \omega^2 L_{opt}^2 (B^2 + D^2) - 2\omega L_{opt}(AB-CD) + A^2 + C^2 \qquad (10)$$

where $$A = R_g Re[\epsilon_1] + Re[\epsilon_2], \quad B = Im[\epsilon_1]$$

$$C = R_g Im[\epsilon_1] + Im[\epsilon_2],$$
$$\text{and } D = Re[\epsilon_1] \qquad (11)$$

Setting $\delta |D|^2 / \delta L_{opt} = 0$ we obtain the following expression for $L_{opt}$ $$L_{opt} = \frac{AB-CD}{\omega(B^2+D^2)} \qquad (12)$$

In order to obtain uniformity across the desired band, the value for $\omega$ used in Equation (12) is the midband frequency (i.e., $\omega = (\omega_{high} + \omega_{low})/2$). Furthermore when possible, symmetrical transducer networks are used symmetry; for a series-parallel network is obtained when $Z_{T1} = Z_{T2} = \ldots Z_{NS_p}$ and $NS_1 = NS_2 = \ldots = NS_p$. These conditions represent an ideal situation and in practice are rarely satisfied. Fortunately perfect symmetry is not required hence some mismatch can be tolerated.

In order to facilitate the formulation of a systematic insertion loss minimization procedure consider the following example.

EXAMPLE 1

Figure 5:
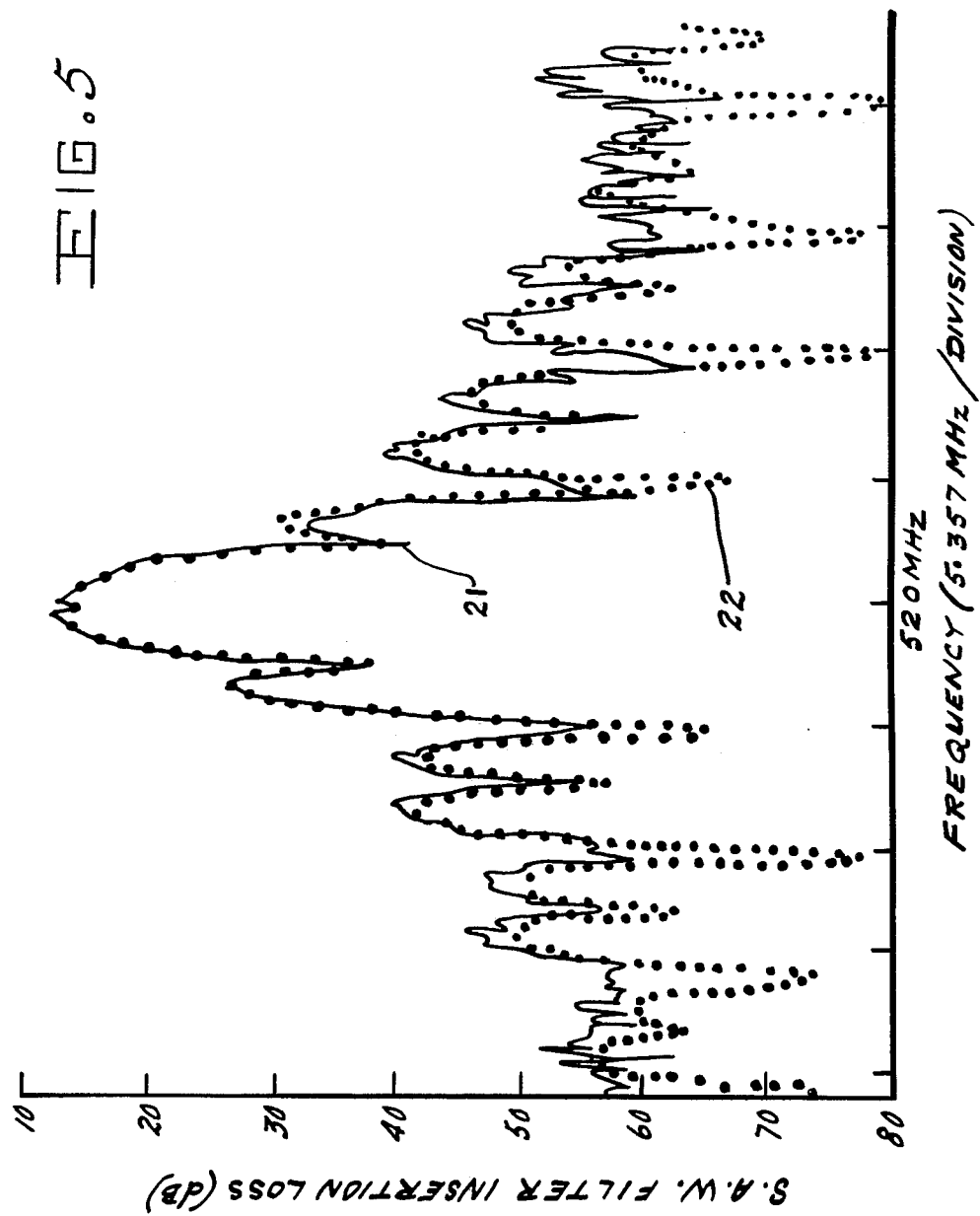
FIG. 5 is a curve illustrating filter insertion loss versus frequency for an example of the invention utilizing a YZ LiTaO$_3$ substrate.
Figure 6:
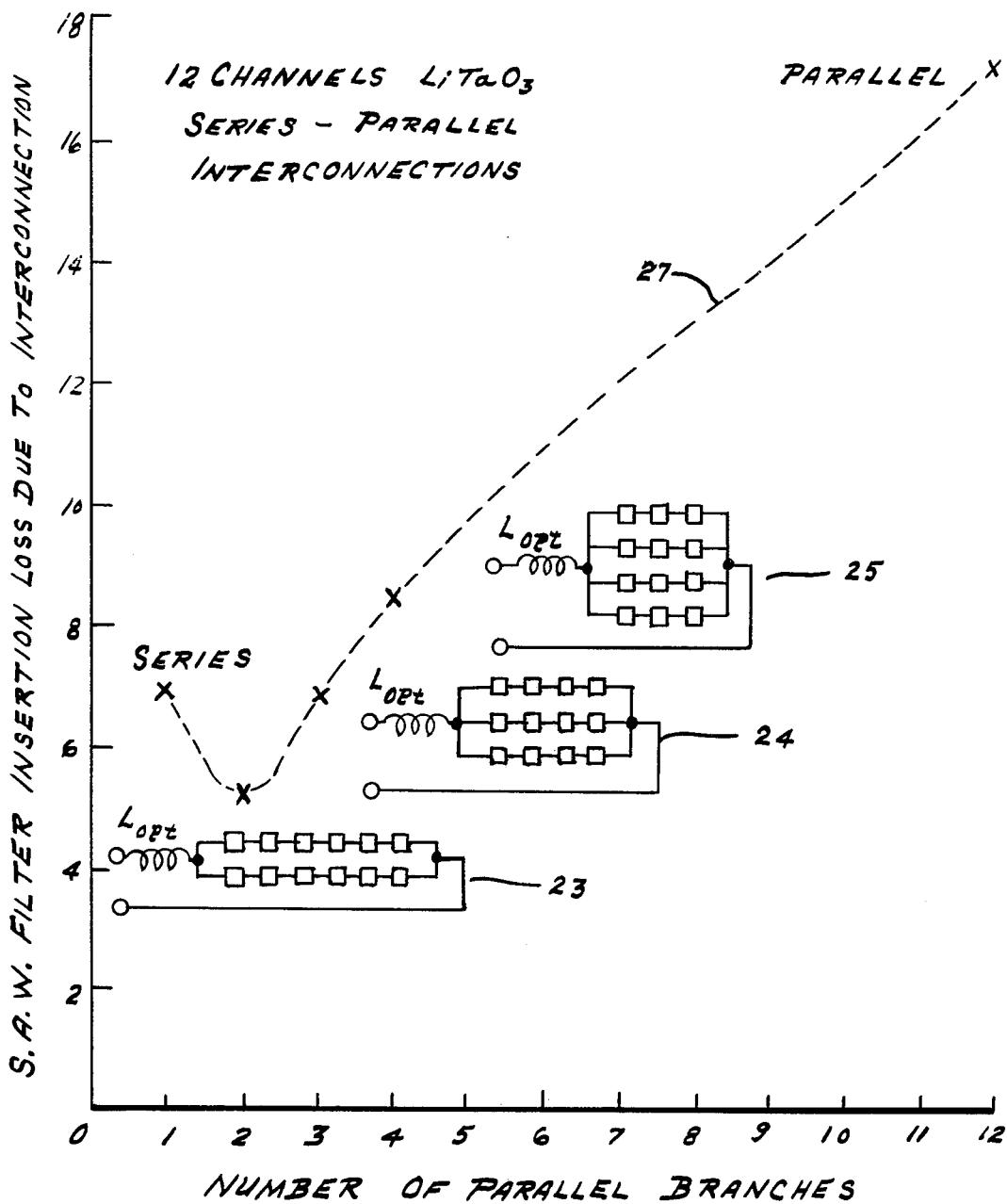
FIG. 6 is a curve illustrating peak loss versus number of parallel transducer branches for a given example of the invention.
Figure 7:
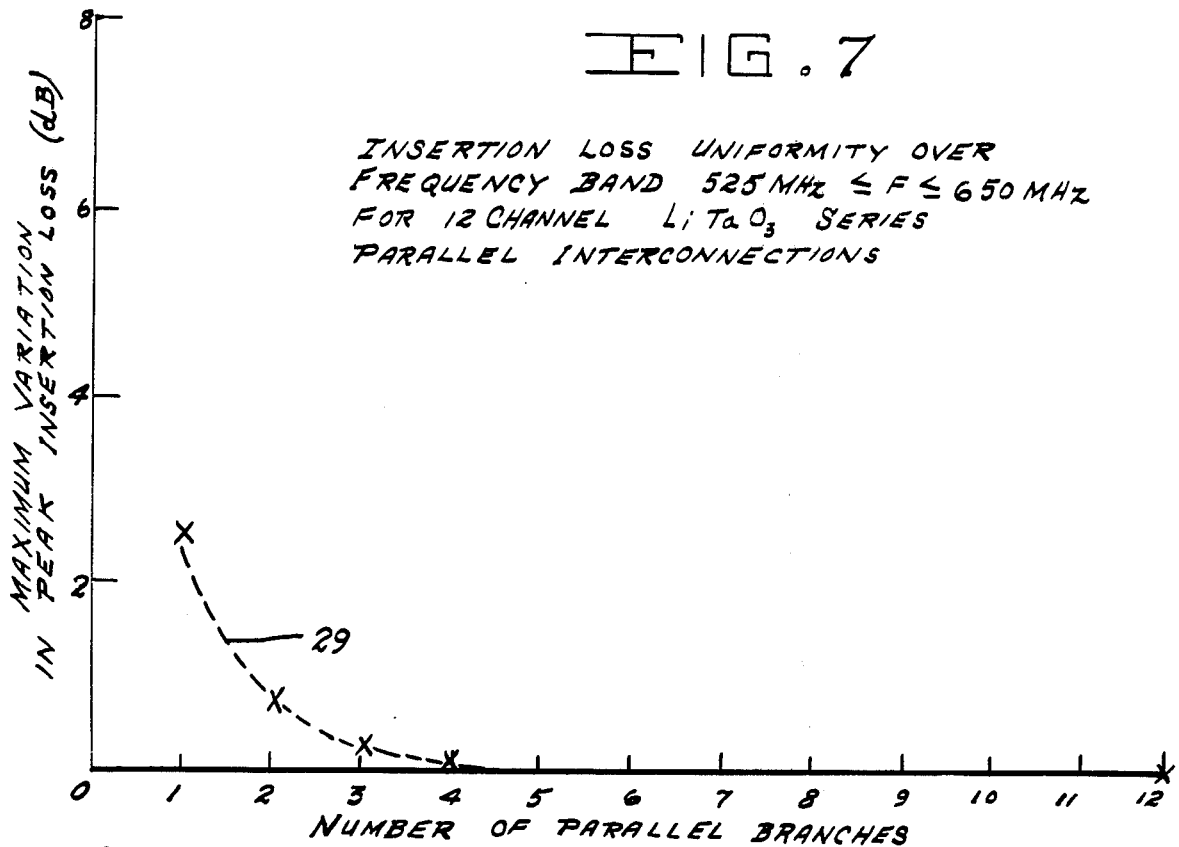
FIG. 7 is a curve illustrating insertion loss uniformity versus number of parallel transducer branches for the sample of FIG. 6.

To design a 12-channel frequency multiplexer (FIG. 1) utilizing a YZ LiTaO$_3$ substrate, operating over the frequency range 520 MHz $\leq f \leq$ 650 MHz. The 12 channels are separated by integer multiples of 5.38 MHz with a typical channel response as shown in FIG. 5. Curve 21 of FIG. 5 indicates measurements made on 12 channel semi-parallel interconnection and dotted curve 22 representing measurements made on an individual channel. To determine appropriate coupling the transducer networks 23, 24, 25 shown in FIG. 6 are considered (with $L_{opt}$ determined at $f_{mid}$=585 MHz for each network). The difference between the individual and coupled channel peak insertion losses are plotted as curve 27 as shown in FIG. 6. These results indicate that optimum coupling is obtained with the two parallel branch series-parallel transducer network 23, where $L_{opt}$ = 43.93 nh. Examining curve 29 of FIG. 9 one observes that the variation in peak insertion loss over the entire band $\leq$ 0.7 db for this network. Wideband uniformity within 1 db is considered acceptable, therefore the design is complete. Examining the design curves shown in FIGS. 6 and 7 reveals an interesting engineering tradeoff; insertion loss for wideband uniformity. The interaction of these two curves 27 and 29 permits the multiplexer designer to achieve the lowest coupling loss for the degree of uniformity required. To further illustrate this tradeoff consider the following example.

EXAMPLE 2

Figure 9:
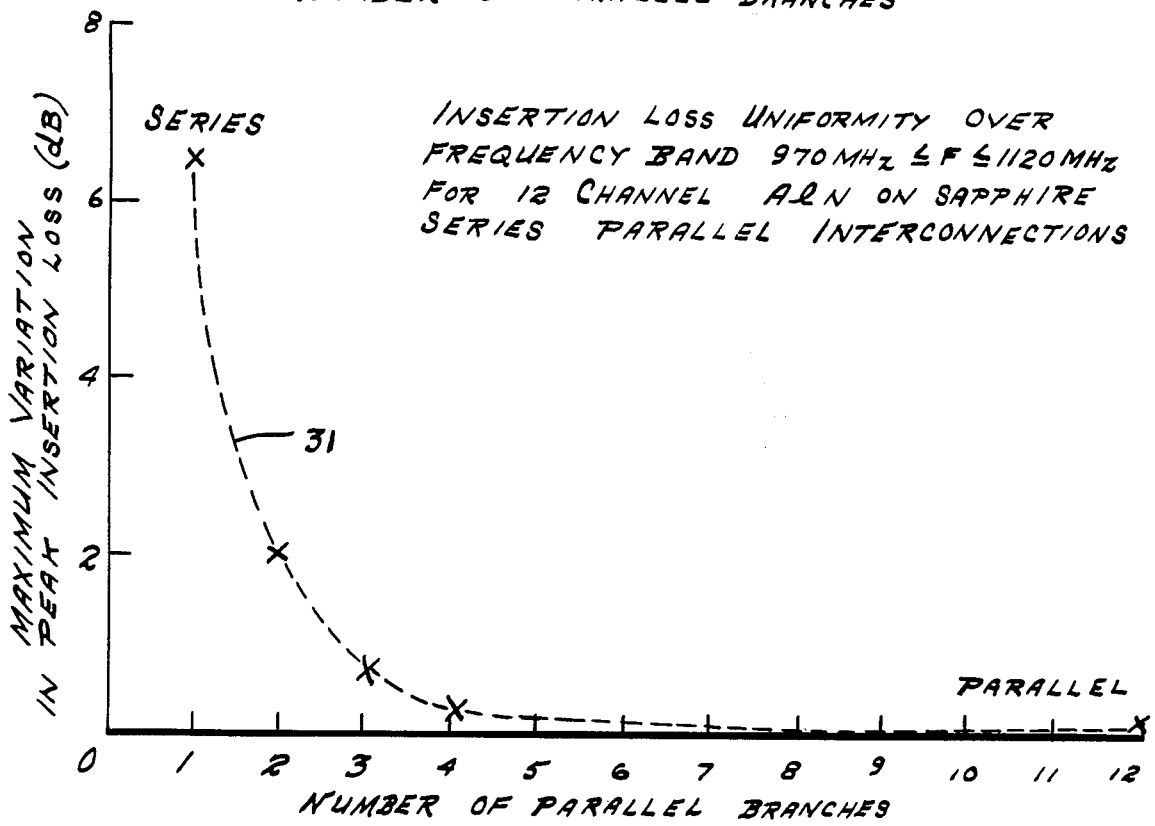
FIG. 9 is a curve illustrating insertion loss uniformity versus number of parallel transducer branches for the example of FIG. 8.
Figure 8:
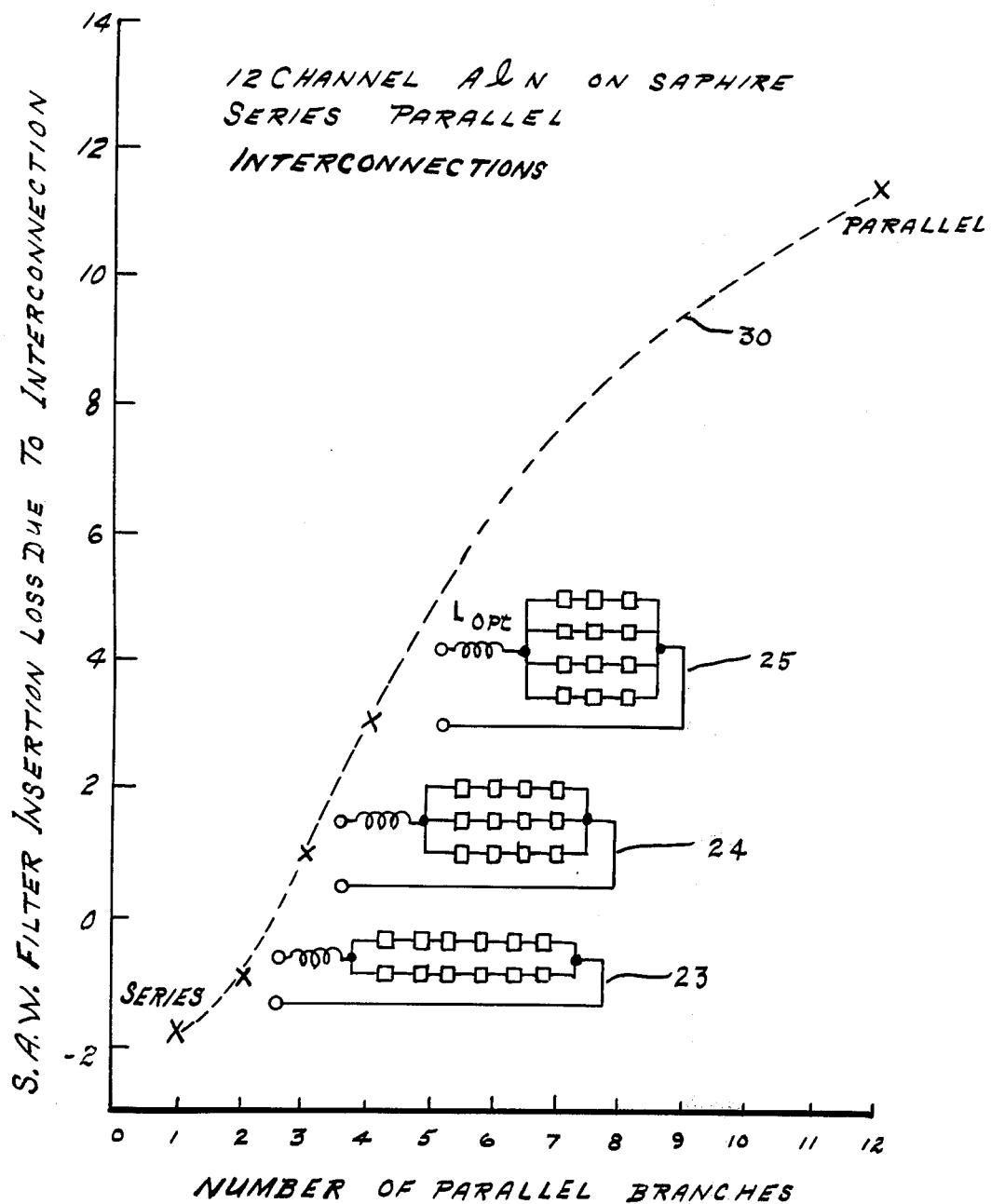
FIG. 8 is a curve illustrating peak loss versus number of parallel transducer branches for a second example of the invention.

To design a 12-channel frequency multiplexer, utilizing the filter responses described in example 1 and a AlN-on-Al$_2$O$_3$ substrate. Due to the faster material this multiplexer operates over the frequency range 970 MHz $\leq f \leq$ 1120 MHz with each channel separated by integer multiples of 10.6 MHz. FIGS. 8 and 9 show the peak insertion loss, curve 30 ($L_{opt}$ determined at $f_{mid}$ = 1045 MHz) and wideband uniformity curve 31. Examining FIG. 8 it appears that a series transducer network yields optimum coupling, however, FIG. 9 indicates that the wideband uniformity is a very poor 6.5 db. Utilizing the uniformity-insertion loss tradeoff, with a desired uniformity of $\leq$ 1 db, it is observed that the three parallel branch transducer network 24 is most appropriate.

Figure 10:
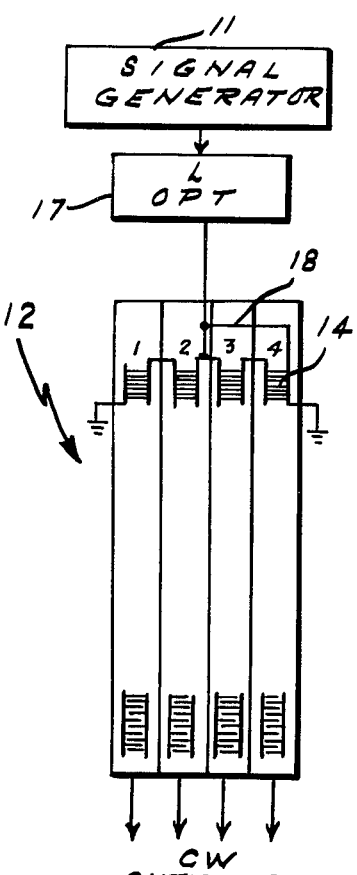
FIG. 10 illustrates schematically a four channel surface acoustic wave multiplexer and a typical series-parallel circuit connection of the input transducer.

A typical transducer electrical connection arrangement is illustrated by FIG. 10. In this instance four channel multiplexer substrate 12 has four input transducers 12 connected in two parallel branches of two series connected transducers by circuit 18. Circuit 18 is connected to signal generator 11 through inductor 17.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. The method of coupling a single channel electromagnetic wave transmission line to the input transducers of a surface acoustic wave device having a multiplicity of channels and an input transducer affixed to each channel thereof comprising the steps of determining the inductance value L that provides minimum transducer insertion loss at the center frequency of the surface acoustic wave device midband channel, initially connecting said input transducers in all possible series, parallel and series-parallel electrical connection arrangements, determining as a function of said inductance value L the insertion loss value for each said series, parallel and series-parallel transducer electrical connection arrangement, determining the channel to channel insertion loss variation for each said transducer electrical connection arrangement, selecting one of said transducer electric connection arrangements that provides minimum insertion loss consistent with prescribed multichannel surface acoustic wave device channel to channel insertion loss variation constraints, and connecting said input transducers in said selected electrical connection arrangement to said electromagnetic wave transmission line through an inductor of said inductance value L.

2. Means for coupling a single channel electromagnetic wave transmission on line to the surface acoustic wave input transducers of a surface acoustic wave device having a discrete frequency range divided into a multiplicity of incremental frequency bandwidth channels and an input transducer affixed to each channel thereof comprising
 an electrical circuit having a single input and arranged to provide m parallel branches of $n$ series connected transducers, $m$ and $n$ being integers that in sum are not less than two and that have values that provide minimum insertion loss consistent with prescribed surface acoustic wave device channel to channel insertion loss variation constraints, and
 an inductor connecting the input of said electrical circuit with said electromagnetic wave transmission line, said inductor having an inductance value L that provides minimum transducer insertion loss at the surface acoustic wave device center frequency.

* * * * *